US006889149B2

(12) United States Patent
Siegers et al.

(10) Patent No.: US 6,889,149 B2
(45) Date of Patent: May 3, 2005

(54) SYSTEM AND METHOD FOR FINGERPRINTING OF SEMICONDUCTOR PROCESSING TOOLS

(75) Inventors: Johan Siegers, Amersfoort (NL); Kornelius Haanstra, Nijeveen (NL); Jan Zinger, Dwingelo (NL)

(73) Assignee: ASM International N.V., Bilthoven (NL)

( * ) Notice: Subject to any disclaimer, the term of this patent is extended or adjusted under 35 U.S.C. 154(b) by 9 days.

(21) Appl. No.: 10/424,219

(22) Filed: Apr. 25, 2003

(65) Prior Publication Data

US 2004/0215410 A1 Oct. 28, 2004

(51) Int. Cl.⁷ .............................................. G06F 19/00
(52) U.S. Cl. ........................... 702/84; 702/81; 702/119; 702/123
(58) Field of Search ............................ 702/81, 84, 119, 702/123; 700/120, 121; 438/5, 7, 14, 16

(56) References Cited

U.S. PATENT DOCUMENTS

| | | | |
|---|---|---|---|
| 4,967,381 A | | 10/1990 | Lane et al. |
| 5,461,570 A | | 10/1995 | Wang et al. |
| 5,526,293 A | | 6/1996 | Mozumder et al. |
| 6,035,305 A | | 3/2000 | Strevey et al. |
| 6,097,887 A | | 8/2000 | Hardikar et al. |
| 6,248,602 B1 | * | 6/2001 | Bode et al. .................... 438/14 |
| 6,256,549 B1 | | 7/2001 | Romero et al. |
| 6,381,509 B1 | | 4/2002 | Thiel et al. |
| 6,385,739 B1 | | 5/2002 | Barton et al. |
| 6,625,497 B2 | * | 9/2003 | Fairbairn et al. .............. 700/1 |
| 2002/0091966 A1 | | 7/2002 | Barton et al. |

OTHER PUBLICATIONS

Mark Bentlage, Bob Hamilton, Rob Neuberger; "Unified System for Manufacturing Process Control and Data Collection;" 2001 Electronic Components and Technology Conference, 3 pages.

Nauman Chaudhry, James Moyne, and Elke Angelika Rundensteiner; "Active Controller: Utilizing Active Databases for Implementing Multistep Control of Semiconductor Manufacturing"; IEEE Transactions on Components, Packaging, and Manufacturing Technology—Part C, vol. 21, No. 3, Jul. 1998, pp. 217–224.

Chih–Min Fan, Ruey–Shan Guo, Shi–Chung Chang, and Chih–Shih Wel; "Shewma: An End–of–Line SPC Scheme Using Wafer Acceptance Test Data"; IEEE Transactions on Semiconductor Manufacturing, vol. 13, No. 3, Aug. 2000 pp. 344–357.

Jeffrey D. Gentry; "A Relational Database Model for Improving Quality Assurance and Process Control In a Composite Manufacturing Environment." 261–267.

Rich Merritt; "Article from Control magazine, Dec. 21, 2001: Extend Quality Control Into the Supply Chain", 10 pages.

George Vosniakos and Jiemin Wang; "A software system framework for planning and operation of quality control in discrete part manufacturing"; Computer Integrated Manufacturing Systems vol. 10, No. 1, pp. 9–25, 1997.

* cited by examiner

Primary Examiner—Bryan Bui
(74) Attorney, Agent, or Firm—Knobbe, Martens, Olson & Bear, LLP

(57) ABSTRACT

A system and method is used for measuring the performance of semiconductor processing tools. A software component may be used to define a set of performance variables and associate performance limits. From the set of performance variables, a set of variables may be selected to create a customized test for a particular tool. The system may be used to store the results of the tests within the system for fast comparison with the associated performance limits, with previous test results, or both. The system may be used to display an overall status of groups of performance variables.

24 Claims, 17 Drawing Sheets

PRIOR ART

FIGURE 7

| | A | B | C | D | E | F | G |
|---|---|---|---|---|---|---|---|
| 1 | # Profiling data temperature | | | | | | |
| 2 | #name | (link) | LSL | UCL | UCL | USL | Units |
| 3 | Spike 100~C | | 60 | 60 | 120 | 120 | ~C |
| 4 | Spike 200~C | | 160 | 160 | 220 | 220 | ~C |
| 5 | Spike 300~C | | 260 | 260 | 320 | 320 | ~C |
| 6 | Spike 400~C | | 360 | 360 | 420 | 420 | ~C |

| | A | B | C | D | E | F | G |
|---|---|---|---|---|---|---|---|
| 1 | !Late Bind | | | | | | |
| 2 | #PN | Link | LSL | LCL | UCL | USL | Units |
| 3 | 2504723-0 | Boat ? Size | 200 | 200 | 200 | 200 | |
| 4 | 2504723-0 | Boat ? Slots | 150 | 150 | 150 | 150 | |
| 5 | 2504723-0 | Boat ? Pitch | 1875 | 1875 | 1875 | 1875 | |
| 6 | 2504723-0 | Boat ? Delta Pit | 0 | 0 | 0 | 0 | |
| 7 | 2504723-0 | Boat ? Offset | 1000 | 1000 | 1000 | 1000 | |

SYSTEM AND METHOD FOR FINGERPRINTING OF SEMICONDUCTOR PROCESSING TOOLS

FIELD OF THE INVENTION

The invention relates to the field of processing equipment and more particularly to quality control testing of such equipment.

BACKGROUND OF THE INVENTION

In manufacturing products, a processing tool executes a treatment according to predetermined conditions on material to be treated. Examples are semiconductor processing tools for the treatment of semiconductor wafers, chemical reactors etc. A semiconductor processing tool typically comprises a number of devices like wafer-handling robots, valves, mass flow controllers, a temperature controller providing input signals to a thyristor pack or silicon controlled rectifier, empowering a heating element, etc. A semiconductor processing tool controller controls these devices to effectuate control over processing conditions such as gas flows, pressure, temperature, etc. For this purpose, the controller comprises a number of digital inputs and outputs and a number of analog inputs and outputs. Via the outputs, the various devices are controlled, and via the inputs, information is collected about the actual conditions in the tool.

These semiconductor processing tools are used to manufacture a myriad of semiconductor products. The consistency and quality of these semiconductor products depends on the consistency and quality of the semiconductor processing tools that are used to manufacture these products. Accordingly, when manufacturing semiconductor processing tools and when installing semiconductor processing tools in a production line, it is desirable that the tools behave consistently or match each other (i.e. "tool matching") to assure a desired level of tool quality.

When manufacturing semiconductor processing tools, quality assurance procedures typically involve making adjustments and performing tests to measure the effect of those adjustments on the performance of the tools. When the tests are performed, certain performance variables are measured and the results are recorded. For verification, the results for the performance variables are then compared to a predefined target value within a predefined window that sets allowable tolerances for tool performance. For example, one test may involve verifying the performance of a heating element. An exemplary performance variable for the heating element is the actual voltage applied to or current through the element in response to particular control signals, which voltage or current should be within a range when the heating element is at a desired temperature. To test the heating element, predetermined signals are sent to control the power sent to the heating element and a voltage or current reading is taken. The measured quantity is compared against expected or desired values for the voltage or current in response to the same control signals. When appropriate, further adjustments may be made, followed by further measuring, recording, comparing or verifying. The process of measurement, recording, and verification is called "fingerprinting."

In the past, quality control tests and results have been manually recorded in paper forms and/or in spreadsheet software programs, such as ones commercially available for office use. This process has disadvantages. First, the paper forms and spreadsheet software programs provided a slow and often impractical system both for analyzing the overall status of the semiconductor processing tool and for comparing that status to the tool's history of performance. Consequently, when a manufacturer of the tool spent more time spent on testing, its manufacturing costs increased and its profits decreased. Similarly, when a purchaser of the tool spent more time spent on testing, the tool's downtime increased and the purchaser's profits decreased. Second, because semiconductor processing tools are often customized according to customers' requests, the forms and/or spreadsheets had to be updated with each change in the tool configuration, which was a slow process. Third, the manual entry entails increased labor costs particularly since quality control tests are performed after a routine maintenance and disassembly to replace consumable parts. Fourth, the forms and spreadsheets risked being lost or misplaced. With the forms and/or spreadsheets, verifying a large set of performance variables (e.g., when testing most or all of the tool's subsystems) was slow, which meant longer manufacturing time for manufacturers and longer downtime for purchasers. Finally, the prior systems did not provide easy means of comparing the test results from one QC run to another QC run, the more so if the first QC run is performed by the manufacturer of the semiconductor processing tools and the other QC run is performed by purchasers of the semiconductor processing tools. Consequently, the customers found it difficult to monitor any changes in the tool.

Embodiments of the present invention seek to overcome some or all of these and other problems.

SUMMARY OF THE INVENTION

Therefore, a need exists for a system and method that performs one or more of the following functions: conveniently collects and stores measured values of tool parameters of a semiconductor processing tool in a quality assurance procedure during manufacturing of the tool, verifies automatically if the values of the measured parameters are within predefined limits, provides an indication relating to the status and value of the measured parameters, and allows end users of a processing tool to repeat the test and compare the test results with the results of previous tests.

Aspects of embodiments include a method comprising measuring a first set of values for a first set of one or more performance variables, the one or more performance variables being adapted to measure the performance of the semiconductor processing tool, storing the first set of values in a first computer-readable medium coupled to the process tool controller, measuring a second set of values for the first set of one or more performance variables, storing the second set of values in a second computer-readable medium coupled to the process tool controller, and retrieving the first set of values from the first computer-readable medium. Other aspects of embodiments include creating a master file, including a second set of one or more performance variables being adapted to measure the performance of the semiconductor processing tool and creating a test file, including the first set of one or more performance variables, wherein the first set of one or more performance variables are selected from the second set of one or more performance variables. Other aspects of embodiments provide that creating the test file comprises selection of the first set of performance variable based upon a classification category of the processing tool. Other aspects of embodiments provide that at least one of the first set of values is acquired using one or more sensors in response to a first user command, the sensors coupled to the process tool controller. Other aspects of embodiments include causing the semiconductor processing tool to perform an action, wherein at least one of the first set of one or more performance variables is adapted to automatically measure a performance value during the action and storing the performance value. Other aspects of embodiments provide that causing the semiconductor processing tool to perform an action is initiated in response to a second user command, the second user command being prior to the first user command. Other aspects of embodiments provide that at least one of the first set of values is acquired by manual input into a software module installed on the process tool controller. Other aspects provide that portions of the method are performed at one or more of the following: prior, during, and after the installation of the tool. Other aspects of embodiments provide that the first computer-readable medium is the second computer-readable medium. Other aspects of embodiments provide that the process tool controller comprises a third computer-readable medium, containing second computer-executable instructions defining a sequence of processing steps in a processing recipe wherein portions of the method are performed at a time when no processing recipe is executed.

Aspects of embodiments include a method comprising storing a first set of performance variables as a master file in a first computer-readable medium, at least one of the first set of performance variables being associated with at least one semiconductor processing tool type and being associated with one or more limit values, selecting a semiconductor processing tool type, and, in response, selecting a second set of performance variables from among the performance variables in the first set of one or more performance variables, said second set of one or more performance variables being associated with the selected semiconductor processing tool type, and storing the second set of one or more performance variables with associated limit values in a second computer-readable medium. Other aspects of embodiments include, for at least one of the second set of one or more performance variables, acquiring a test value and displaying a comparison of the acquired test value to at least one associated limit value. Other aspects of embodiments provide that the second set of one or more performance variables comprises one or more groups of variables and further comprising displaying an aggregate display of the comparison status of the individual performance variables within at least one of the groups of variables. Other aspects of embodiments include at least one software module installed on the process tool controller. Other aspects of embodiments include, for at least one of the second set of one or more performance variables, displaying whether a value has been acquired for the variable. Other aspects of embodiments provide that the second set of one or more performance variables comprises one or more groups of variables and further comprising displaying an aggregate display of the acquisition status of the individual performance variables within at least one of the groups of variables.

Aspects of embodiments include a process tool controller configured to perform a method for assuring the quality of a semiconductor processing tool coupled to the process tool controller, the method comprising acquiring a first set of values for test file, the test file comprising a subset of semiconductor processing tool performance variables automatically generated from a master file, storing the first set of values in a first computer-readable medium. Aspects of embodiments include the first computer-readable medium is in the controller. Aspects of embodiments provide that the first computer-readable medium is coupled to the controller. Typically, the quality assurance steps described herein are not performed during wafer processing; accordingly, the processing tool is typically void of actual production wafers during quality assurance testing as described herein. Thus, the process tubes (e.g., reactors above the carousel inside the processing chamber) are preferably empty of wafers during the quality assurance testing.

For purposes of summarizing the invention, certain aspects, advantages and novel features of the invention have been described herein. Of course, it is to be understood that not necessarily all such aspects, advantages or features will be embodied in any particular embodiment of the invention.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 7 shows a preferred embodiment of a "limits file" having one or more sets of defined limits and an associated unit of measurement that may be associated with one or more performance variables.

FIG. 9 shows one embodiment of a file having one or more sets of predefined limits and an associated unit of measurement for "late binding" a performance variable in a test file in accordance with a preferred embodiment of the present invention.

DETAILED DESCRIPTION OF THE PREFERRED EMBODIMENTS

To facilitate a complete understanding of the invention, the remainder of the detailed description describes the invention with reference to the drawings.

Figure 16:
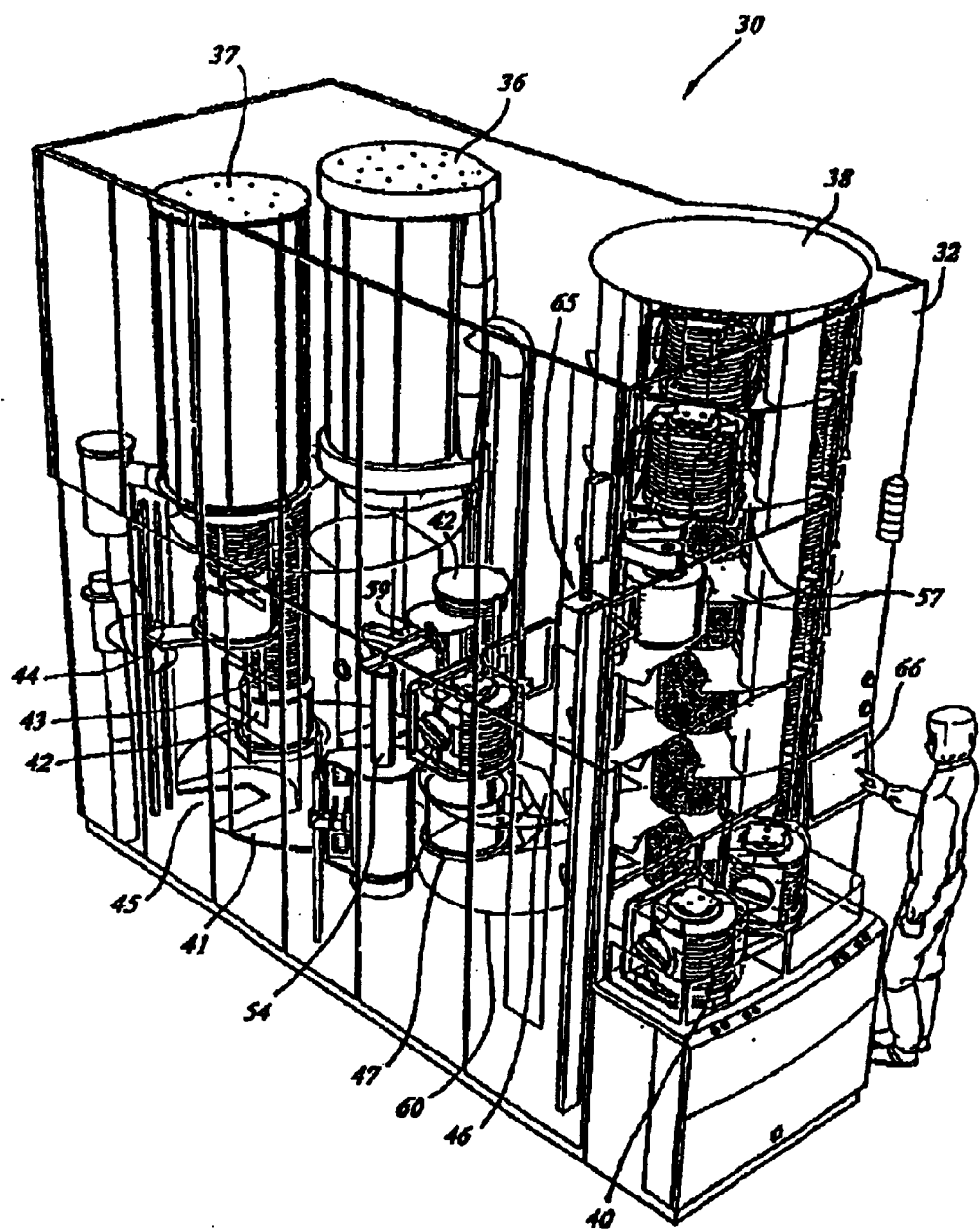
FIG. 16 shows a perspective view of an exemplary exemplary semiconductor processing system for use with preferred embodiments of the invention.
Figure 17:
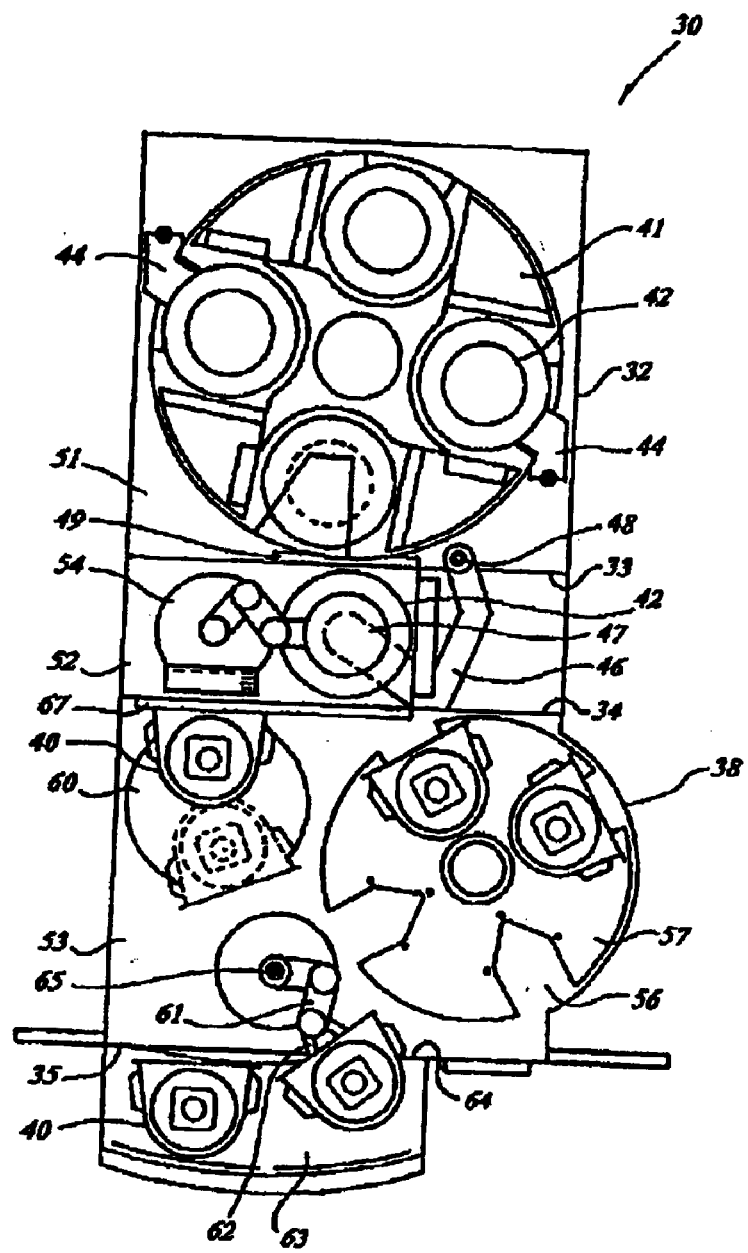
FIG. 17 shows a schematic plan view of the system of FIG. 16.

With reference to FIGS. 16 and 17, an exemplary semiconductor processing system containing a process chamber is illustrated and indicated generally by the reference numeral 30. The exemplary system 30 of FIGS. 16 and 17 comprises a housing 32 and is generally installed in a so-called "clean room." In addition to the housing 32, partitions 33, 34 and 35 (omitted from FIG. 16 for clarity of illustration) are also present. The housing 32 delimits, with the partition 33, a processing chamber 51. The processing area 51 comprises reactors, which in this example, are vertical furnaces 36, 37. The housing 32 and the partitions 33 and 34 define a wafer handling section or chamber 52. A cassette transfer section or chamber 53 is defined between the housing 32 and partitions 34 and 35. An input/output station, to transfer cassettes into and out of the system 30, is indicated by reference numeral 63.

Wafers are supplied in cassettes 40, which are placed on the input/output station 63. A front opening unified pod (FOUP) according the preferred embodiments preferably serves as the cassette 40. A cassette handling device 61 transfers the cassettes 40 from the input/output station 63 through a closable opening 64 into a cassette store 38 located in the cassette transfer section 53. The cassette store 38 is provided with a number of vertically aligned rotary platforms 57 on which the cassettes 40 are stored. The cassette handling device 61 is movable in a vertical direction by means of an elevator 65 so that the different platforms 57 can be reached. The cassette handling device 61 is provided with a cassette end effector 62, which has dimensions a little smaller than those of a series of cut-outs 56 in the rotary platforms 57. When the cassette handling device 61 has transferred a cassette 40 into the store 38, the end effector 62 of the cassette handling device 61 can be lowered through one of the cut-outs 56 in one of the platforms 57 to place the cassette 40 on the platform 57. Subsequently, the cassette handler 61 can be retracted from the cassette store 38. The cassette handling device 61 is mounted such that it is able to transfer cassettes 40 between the input/output station 63 and the store 38. The device 61 is also capable of transferring cassettes 40 between the store 38 and a rotatable cassette transfer platform 60, or between the input/output station 63 and the rotatable cassette transfer platform 60.

The rotatable cassette transfer platform 60 is constructed such that, on rotation, the cassette 40 is placed against the partition 34 between the cassette transfer section 53 and the wafer handling section 52. The partition 34 is provided with a closure and a closure mechanism, together forming an interface schematically indicated by the reference numeral 67. After placing the cassette against the interface 67 in the partition 34, the closure mechanism grips and unlocks the closure of the cassette and simultaneously opens the closure in the partition 34 and the closure of the cassette.

A wafer handling device 54 within the wafer handling section 52 transfers wafers between the cassette concerned and a boat 42. The boat 42 accommodates more wafers than can be held in the cassettes of the preferred embodiments, i.e., more than 25 wafers when using presently standard FOUPs, preferably more than 50 wafers and, more preferably greater than 70 wafers. As discussed herein, the wafer handling device 54 preferably comprises a robot end effector 59 configured to handle individual wafers. To load a wafer into the boat 42, the wafer handling device 54 transfers wafers from cassettes 40 into the boat 42. Each of the boats 42 is supported on a pedestal. A doorplate is preferably provided below each of the pedestals.

After loading of wafers into the boat 42 is completed, a transfer arm 46 preferably moves the boat 42 upon a support surface 47 through an openable closure 49 in the partition 33 from the wafer handling chamber 52 into the processing chamber 51. The illustrated processing section 51 is provided with a rotary transfer platform 41, supporting a plurality of boats 42. Two reactors, which in this case comprise furnaces 36, 37, are arranged in the processing chamber 51. The furnaces 36, 37 are positioned vertically and boats 42, filled with wafers, are introduced vertically into the furnaces 36, 37 from below. To this end, each furnace 36, 37 has an insertion arm 44, which is movable in the vertical direction. The doorplates below the boats 42 serve to seal the reactors from the outside processing section when the boats 42 are lifted up into the reactors.

The processing of a large number of wafers can be carried out as follows: the operator, shown diagrammatically in FIG. 16, loads the store 38 by introducing a number of cassettes 40 on the input/output station 63 and carrying out control operations on a control panel 66. Each of the cassettes 40 is transferred from the input/output station 63 with the aid of the cassette handling device 61 into the storage compartments 39 made for these cassettes in the store 38, specifically on the stacked rotary platforms 57. By rotation of the store 38 and use of the elevator 65, it is possible to fill various compartments with the cassettes 40. After filling the store 38, no further human interaction is required with this exemplary automated installation.

The cassettes 40 concerned are then removed from the store 38 by the cassette handler device 61 and placed on the cassette transfer platform 60. The cassette transfer platform 60 comprises two levels, schematically indicated in FIG. 16, each level capable of receiving a cassette, where the two levels can be rotated independently of one another. Upon rotation of the cassette transfer platform 60, the cassettes are placed against the partition 34. After opening of the closure of the cassette, together with the closure 67 in the partition 34, the wafers are removed by the wafer handler 54, and placed in a boat 42. After the boat 42 has been filled, and becomes available for one of the reactors 36, 37, the closure 49 in partition 33 is opened and the wafer boat or support holder 42 is placed on the transfer platform 41 by the transfer arm 46. The transfer platform 41 then moves the boat 42 within the process chamber 51 to a position below the reactor to be loaded. Then the insertion mechanism or elevator 44 moves the boat 42 into the reactor 36 or 37. Treated wafers move counter to the course described above after being lowered and cooled within the process chamber 51.

Figure 1:
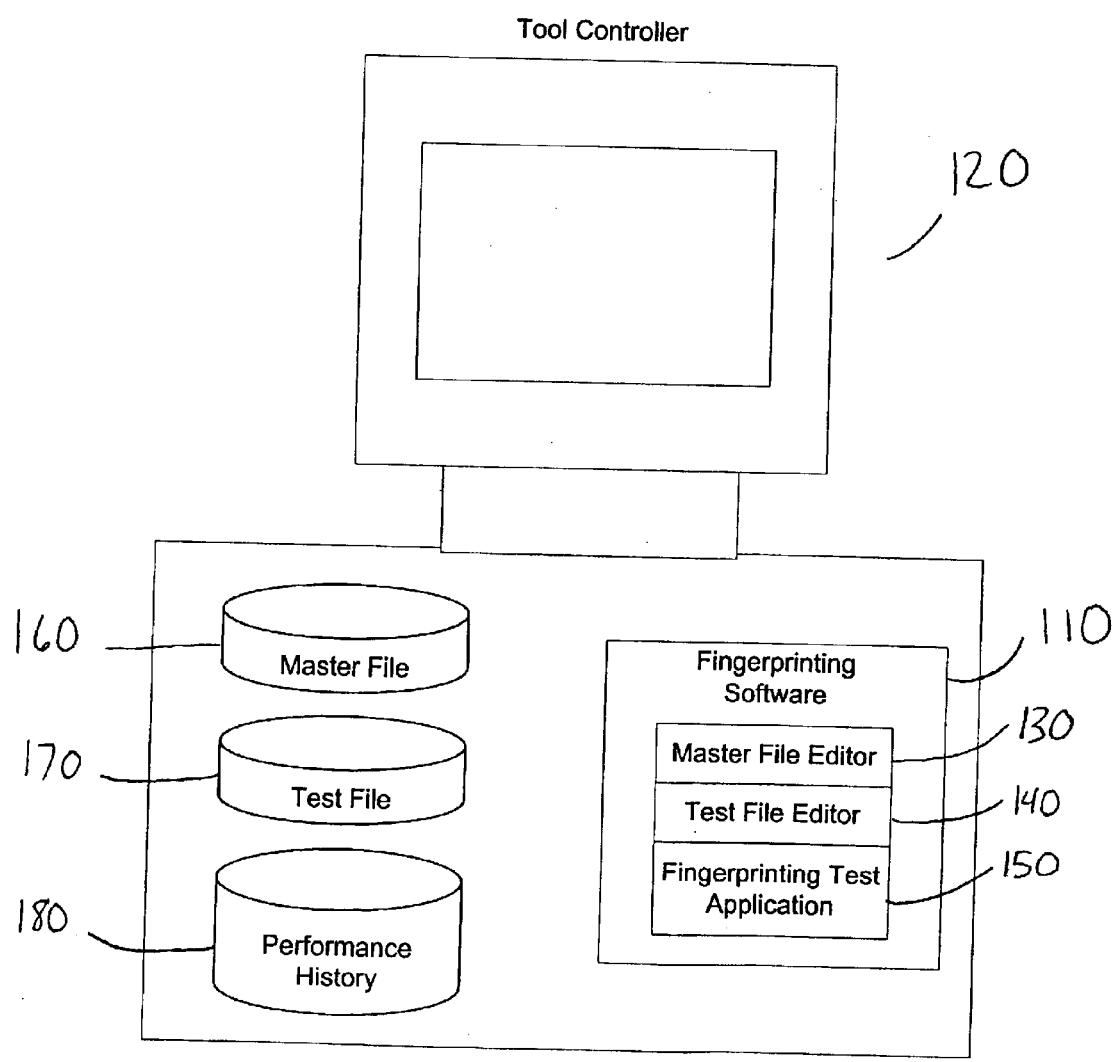
FIG. 1 shows a tool controller in accordance with a preferred embodiment of the present invention.

FIG. 1 illustrates a fingerprinting software 110 that is advantageously used to ensure the quality of a semiconductor processing tool (not shown): performance variables are advantageously defined, performance tests are advantageously created and executed, and performance test histories are advantageously stored.

As illustrated in FIG. 1 at least a portion of a fingerprinting software 110 resides in a controller 120 of the semiconductor processing tool. The fingerprinting software 110 preferably comprises three modules: a master file editor 130, a test file editor 140, and a fingerprinting test application 150. In another embodiment, one or more modules of the fingerprinting software are installed in one or more computers other than the controller 120, including but not limited to a computer coupled to the process tool controller 120. Although the fingerprinting software is disclosed with reference to its preferred embodiment, the invention is not intended to be limited thereby. Rather, a skilled artisan will recognize from the disclosure herein a wide number of alternatives for the fingerprinting software.

The master file editor 130 is preferably used to define the performance variables that are used to measure the performance of one or more semiconductor processing tools. The master file editor 130 creates and edits a master file 160, which contains one or more performance variables. Within the master file, a variable is advantageously associated with a desired target value and with one or more performance limits, including but not limited to an upper specification limit, a lower specification limit, an upper control limit, and a lower control limit. The specification limits define an acceptable range of performance; the control limits define a narrower, preferred range of performance; and the target value defines a preferred performance value. A previously created variable may advantageously be redefined by setting and/or changing limits for the variable. The master file 160 is preferably stored on a computer-readable medium in a computer coupled to controller 120. However, the master file 160 may be stored on a computer-readable medium in any suitable location such as the controller 120 or a computer not coupled to the controller 120. In one embodiment, the master file 160 is a database. The master file editor 130 is preferably installed on a computer coupled to controller 120. However, master file editor 130 may be installed in any suitable location, including but not limited to the controller 120 or a computer not coupled to the controller 120.

The test file editor 140 creates a test file 170, which includes one or more variables selected from the master file 160. Thus, the test file editor 140 may advantageously be used to select a customized set of variables for testing a specific semiconductor processing tool. Different genera ("types") of tools may require tests that are at least partly specific for the tool (e.g., oxidation furnace and a low pressure chemical vapor deposition, or LPCVD furnace are different genera). Further, within a genus, species may have different "hardware configurations" (e.g. LPCVD polysilicon furnace and LPCVD nitride furnace are of the same genus, but are different species). Accordingly, in the preferred embodiment, the test file editor 140 may advantageously be used to customize a set of variables for particular tool types, particular hardware configurations, or both.

Thus, the preferred embodiment provides a multi-level classification that permits the testing of tools according to type and according to certain configurations within a type. Other embodiments provide for multi-level classification of tools according to any number of suitable classifications and groupings. For example only and not to limit the scope of the invention, the following types of tools are commercially available from ASM International, N.V. of Bilthoven, The Netherlands, or its subsidiaries: low pressure chemical vapor deposition (LPCVD) furnace, atmospheric furnaces, single wafer epitaxial deposition reactors, atomic layer deposition (ALD) reactors, etc. For example only and not to limit the scope of the invention, two configurations for the same type of tool is an LPCVD polysilicon furnace for customer X or an LPCVD nitride furnace for customer Y. Typically, each configuration requires its own specific set of performance variables and the types are used to define the set of performance variables for a specific configuration in an efficient way. Accordingly, selecting a customized set of variables for testing a specific semiconductor processing tool advantageously enables testing adapted for different tool genera (e.g., reactor types) and for species within a genus (e.g., reactor hardware configurations).

The test file 170 is preferably stored on a computer-readable medium in controller 120. However, the test file 170 may be stored on a computer-readable medium in any suitable location such as in a computer coupled to the controller 120. In one embodiment, the test file 170 is a database. The test file editor 140 is preferably installed on the controller 120. However, test file editor 140 may be installed in any suitable location, including but not limited to a computer coupled to the controller 120 or a computer not coupled to the controller 120.

The fingerprinting test application 150, which is used to test the variables in the test file, is preferably installed on the controller 120. With the fingerprinting test application 150 installed on the controller 120, the fingerprinting test application 150 can advantageously collect certain measurements without manual entry. Because the controller 120 can access sensing devices within the tool, the controller 120 automatically measures the tool's performance as to certain variables, which the fingerprinting test application 150 collects without manual entry. Examples include without limitation: a pressure measured by a pressure sensor; the time required for a robot to perform a predefined movement; the electrical current drawn by a drive motor during the performance of a movement; and software release numbers of the control software installed on the tool. In some instances, the system can measure some variables semi-automatically, where testing requires physical setup or verification of setup before automatically measuring the variables (e.g., a boat of a certain type is installed before testing robotic loading). Once the physical setup or verification of setup is performed, the controller 120 automatically measures the tool's performance as to certain variables, which the fingerprinting test application 150 collects without manual entry. In addition to the automatically and semi-automatically measured variables, certain variables may require a manual inspection. Examples include without limitation: visually inspecting wires or manually measuring voltage applied to or current flowing through a heating element. These manually collected measurements can advantageously be entered into the fingerprinting test application 150 via any suitable input device (e.g., a keyboard, a mouse, a touch screen, or the like). In a preferred embodiment, the fingerprinting test application 150 is preferably installed in the controller 120. The fingerprinting test application 150 may be installed in any suitable location such as a computer coupled to the controller 120.

The fingerprinting test application 150 preferably indicates the testing status for one or more performance variables. In one embodiment, the fingerprinting test application 150 indicates one or more of the following for a performance variable: whether a measurement has been collected for the performance variable, whether the measurement is within one or more performance limits, and whether the measurement is at a desired target value. When the testing results are not satisfactory, further adjustments may be made with further testing.

The fingerprinting test application 150 advantageously stores the measurements as performance history data 180 on a computer-readable medium in any suitable location, preferably on a computer-readable medium in the controller 120. The risks associated with lost or misplaced data are reduced when the measurements are stored centrally in a computer-readable medium in the controller 120. In another embodiment, the performance history data 180 is stored in computer-readable medium coupled to the controller 120. In the preferred embodiment, the performance history data 180 is stored in at least one output file, one or more of which represent a "fingerprint" of the tool's status. In another embodiment, performance history data 180 is a database. In one embodiment, the fingerprinting test application 150 advantageously permits comparison of currently collected performance data to the previously collected performance history data. For example, where performance variables are tested at the tool manufacturer, the results can be stored in the performance history data 180. Accordingly, the tool purchaser can subsequently test one or more of those variables and compare those new test results to the quality assurance tests performed during manufacturing of the tool. Further, the new tests results can be stored in the performance history data 180 for comparison with future tests. In one embodiment, the fingerprinting software 110 displays a comparison of one set of test results to an earlier set of test results.

Figure 2:
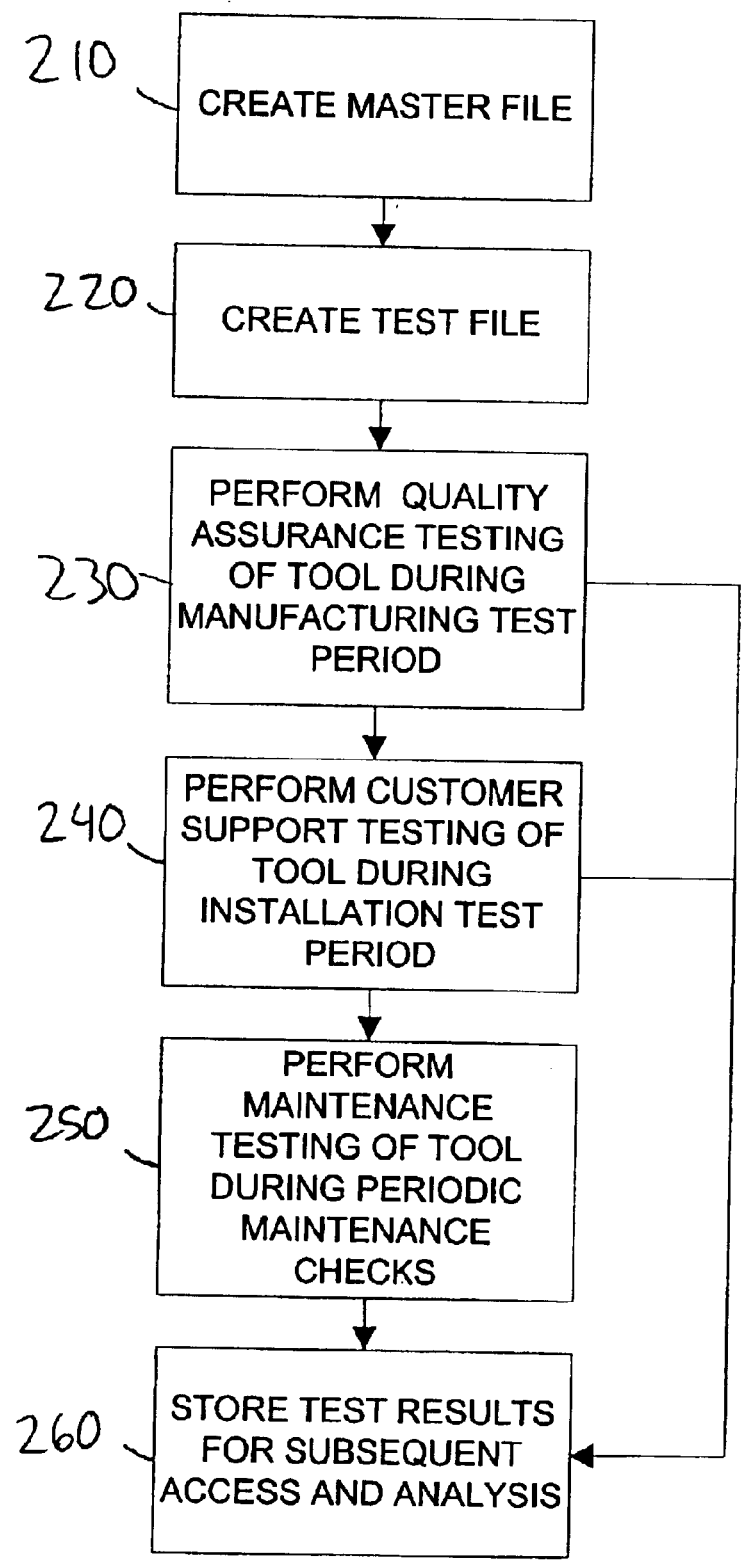
FIG. 2 is a process flow diagram of a fingerprinting process in accordance with a preferred embodiment of the present invention.
Figure 3:
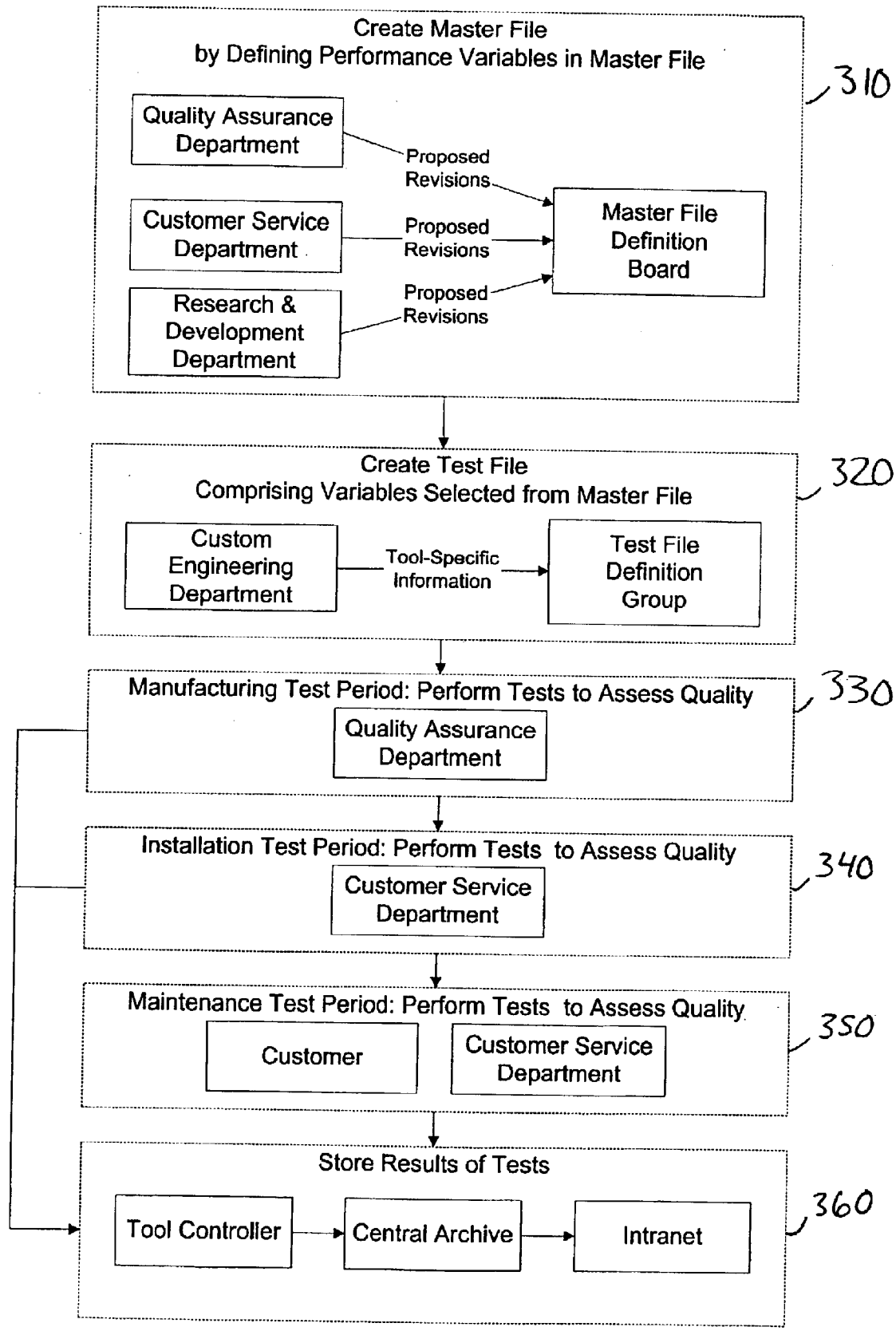
FIG. 3 is a more detailed process flow diagram of the fingerprinting process in accordance with a preferred embodiment of the present invention.

FIG. 2 and FIG. 3 illustrate a process in accordance with a preferred embodiment of the present invention. At a block 210, the master file 160 (FIG. 1) is created using the master file editor 130 (FIG. 1). Block 310 illustrates a more detailed embodiment in which block 210 is further described. The master file 160 may advantageously be designed to meet the needs and standards of various departments within a company that manufactures semiconductor processing tools. For example, as shown in the block 310, a customer service department, quality assurance department, or the like may generate test requirements for the quality assurance testing of a tool during the manufacturing test period. Also, a research and development department may generate test requirements for newly developed tools or new test requirements for existing tools. The company may provide a centralized review of the input that the various departments provided. For example, persons on a master file definition board may approve or reject the incorporation of new variables into the master file 160 or approve or reject changes of existing variables in the master file 160, and use the master file editor 130 to edit the master file 160 accordingly. By designing the master file 160 to meet the needs and standards of various departments within the company, the master file 160 advantageously comprises the collective work of the company.

At a block 220, the test file 170 (FIG. 1) is created using the test file editor 140 (FIG. 1). Block 320 illustrates a more detailed embodiment in which block 220 is further described. A customer engineering department may provide specific information about the tool for which the test file is customized. A test file definition group may advantageously use the test file editor 140 to create the test file 170. As further described below, performance variables in the master file 160 are advantageously associated with one or more tool types and/or tool configurations, which the fingerprinting software 110 (FIG. 1) uses to generate a test file automatically.

Block 230 in FIG. 2 illustrates that, as the semiconductor processing tool is manufactured, tests are performed on the tool during the manufacturing test period. Block 330 illustrates a more detailed embodiment in which block 230 is further described. For example, a manufacturing department may use the fingerprinting test application 150 to perform tests during the manufacturing test period. The results of these tests are preferably collected as performance history data 180 (FIG. 1) and stored on the tool controller 120 (FIG. 1). The quality assurance department uses the fingerprinting test application 150 to review the testing status for one or more performance variables and assess the quality of the tool.

Block 240 illustrates that, after manufacturing, the semiconductor processing tool is installed and tested at a customer site. Block 340 illustrates a more detailed embodiment in which block 240 is further described. For example, a tool manufacturer's customer service department may use the fingerprinting test application 150 (FIG. 1) to perform tests during the installation test period. The results of these tests are preferably collected as performance history data 180 and stored on the tool controller 120. The customer service department uses the fingerprinting test application 150 to review the testing status for one or more performance variables and assess the quality of the tool.

Block 250 in FIG. 2 illustrates that, after installation and the customer begins using the semiconductor processing tool, maintenance testing of the tool can be performed during periodic maintenance checks. Block 350 illustrates a more detailed embodiment in which block 250 is further described. For example, the customer service department or the customer may perform these tests use the fingerprinting test application 150 (FIG. 1) to perform tests during the maintenance test period. The results of these tests are preferably collected as performance history data 180 and stored on the tool controller 120. The customer service department or the customer uses the fingerprinting test application 150 to review the testing status for one or more performance variables and assess the quality of the tool.

Block 260 in FIG. 2 illustrates one embodiment wherein the performance history data 180 (FIG. 1) generated by quality assurance testing, the performance history data 180 generated by customer support testing, and the performance history data 180 generated by maintenance testing are advantageously stored for subsequent access and analysis in any suitable location, preferably on a computer-readable medium in the controller 120. Block 360 illustrates a more detailed embodiment in which block 260 is further described. For example, in a further embodiment, the performance history data 180 is exported from the controller 120 to an archive for storage and for analysis purposes. In another embodiment, the performance history data 180 is uploaded from the archive to a tool for local analysis or comparison. In yet another embodiment, the archived performance history data 180 and related analysis results are available through a company's Intranet and/or the Internet. For example, several departments may wish to access this archived information, including the research and development department, the quality assurance department, and the customer service department. In other embodiments, any suitable method of archiving (e.g., centralized, distributed) and any suitable method of accessing the archive (e.g., a network or the like) may be used.

Figure 4:
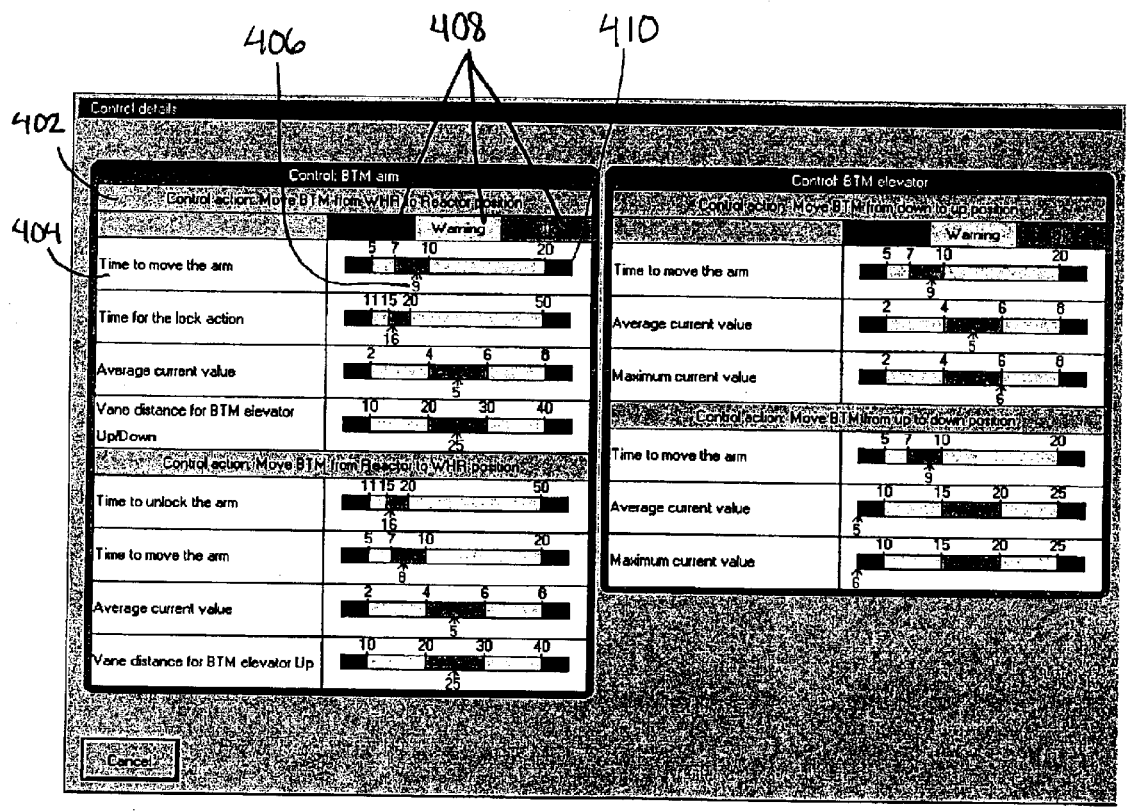
FIG. 4 shows a prior art performance analysis screen for a semiconductor processing tool.

FIG. 4 illustrates a prior art performance variable analysis for a semiconductor processing tool used during actual processing. Specifically, FIG. 4 illustrates analysis provided with previously available tools made by ASM International, N.V. of Bilthoven, The Netherlands, or its subsidiaries. In particular, FIG. 4 illustrates a number of "control actions" or robotic movements that the particular tool takes. For example, a control action 402 represents a control action to move a boat transfer mechanism from a position accessible to a wafer handling robot to a reactor position. Performance variables and an associated limit bar are displayed with the control actions. For example, a performance parameter or variable 404 represents the time to move the arm. A measured value is associated with a performance variable. For example, an indicator 406 displays a measured time value of "9," representing 9 seconds. Visually displayed is a limit bar, tailored for each variable. A legend 408 is used to interpret a limit bar for a given parameter. For example, a limit bar 410 is associated with the parameter or variable 404 of control action 402. As illustrated, the limit bar 410 indicates that a time value below 5 or above 20 is in an error range, that a time value between 5 and 7 or between 10 and 20 is in a warning range, and that a time value between 7 and 10 is in an acceptable or "OK" range. The indicator is used with the limit bar to indicate the range in which the measured value occurred. For example, indicator 406 shows that the time value "9" is in an acceptable range. The warning range is used to indicate that, given the measured value, attention is required. The error range may is used to indicate that, given the measured value, immediate attention is required. The bars have no other functionality than just an aid during visual inspection of the variables by a maintenance engineer. Alarms are not generated automatically. The functionality of this software, corresponding to this screen, is limited: each time that a certain motion is performed, the defined variables are measured and stored, overwriting previously stored values, if any. Upon operator request, the values can be displayed on a screen for inspection, for maintenance and adjustment purposes, or for manual recording.

The preferred embodiment will be further described below with reference to figures that illustrate various aspects of the finger printing software. Specifically, the preferred embodiment will be discussed with reference to the preferred aspects of the fingerprinting software 110, comprising a master file editor 130, a test file editor 140, and a fingerprinting test application 150.

Master File Editor

The master file editor 130 is preferably used to define the performance variables that are used to measure the performance of one or more semiconductor processing tools. Later, the performance variables may advantageously be selected from the master file 160 by the test file editor 140 to create a tool-customized test file 170.

In one embodiment, the master file editor 130 is a software module separate from the control software for a tool. Thus, the master file editor 130 may advantageously be retrofit to be installed on an existing tool. In another embodiment, the master file editor 130 is installed on a separate computer coupled to controller 120. This embodiment helps to prevent a user of the tool or a tester of the tool from altering the test criteria established by supervisors. Another embodiment limits access to the master file editor using a suitable method, including but not limited to a password or the like, which also helps to reduce inadvertent or unauthorized alteration of test criteria.

Figure 5:
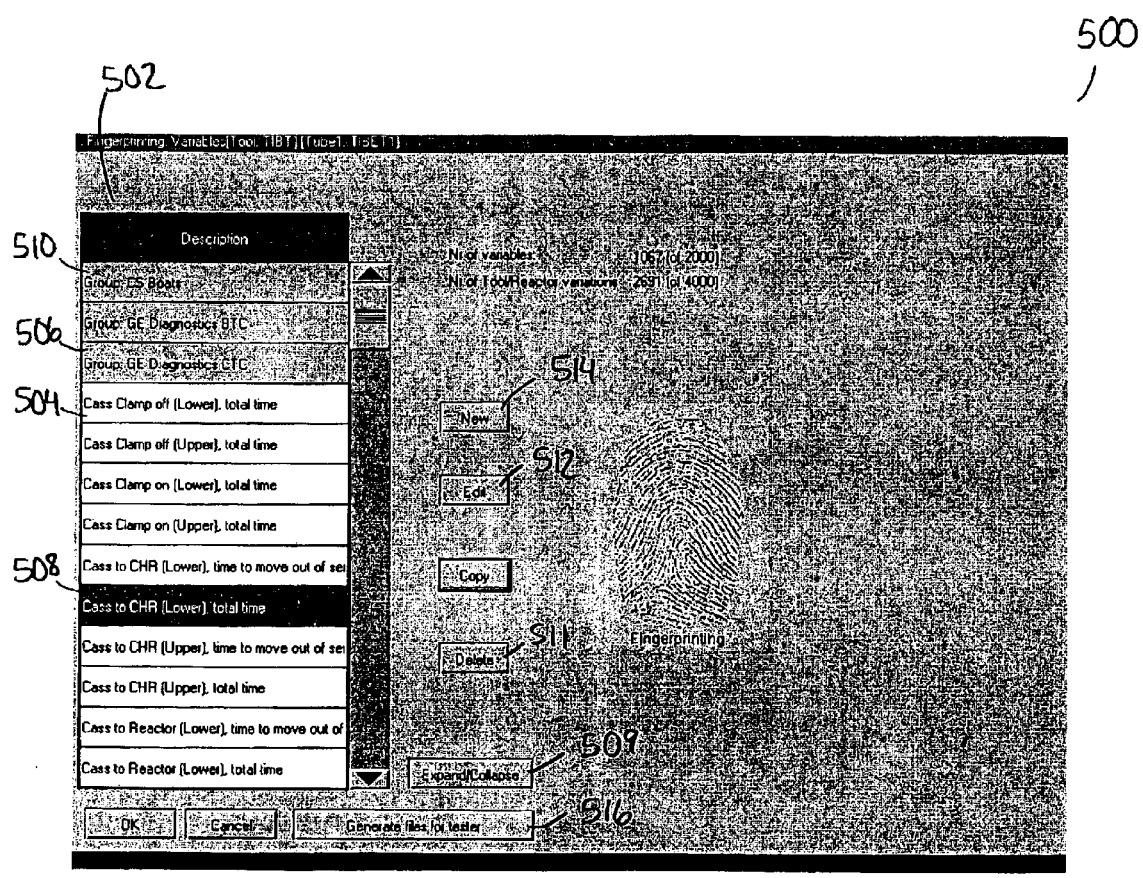
FIG. 5 shows a variable editor screen for viewing, editing, and deleting performance variables used in measuring the performance of a semiconductor processing tool in accordance with a preferred embodiment of the present invention.

FIG. 5 illustrates a variable editor screen 500 of the master file editor 130 in accordance with a preferred embodiment. A menu 502 displays available performance variables. The menu 502 advantageously displays one or more single variables, for example, variable 504. A single variable may advantageously be given a color to represent that it is a single variable, such as, for example, white. The menu 502 also advantageously displays one or more groups of variables, for example, variable group 506, entitled "GE Diagnostics CTC" [general diagnostics cassette transfer controller]. A group of variables may advantageously be given a color to represent that it is group of variables, such as, for example, light gray. When a variable or a group of variables is selected, the variable or group may advantageously be given a color to represent that it is currently selected, such as dark gray. For example, variable 508, entitled "Cass to CHR [cassette handling robot] (Lower), total time," is currently selected. The variable 508 represents the time for the lower level of the cassette transfer platform 60 (FIGS. 16, 17) to rotate between a position facing cassette interface 67 (FIG. 17) and a position wherein the cassette handling device can grip the cassette. When a group is selected, an expand/collapse button 509 will appear on the screen. When the selected group is in a collapsed state, selecting the expand/collapse button causes the group to expand for viewing the individual variables in the group. For example, the variable group 506 ("Group: Diagnostics CTC") is illustrated as having been expanded, listing a plurality of related single variables beneath the variable group name 506. When the selected group is in an expanded state, selecting the expand/collapse button causes the group to collapse. For example, variable group 510, entitled "CS Boats," is illustrated as having been collapsed. In a further embodiment, when selecting the expand/collapse button causes a group to expand, the selection also advantageously causes all other groups to be collapsed. Pressing button 511 deletes a variable. As illustrated in FIG. 5, with the variable 508 being currently selected, an edit button 512 is pressed to open the variable definition screen illustrated in FIG. 6.

Figure 6:
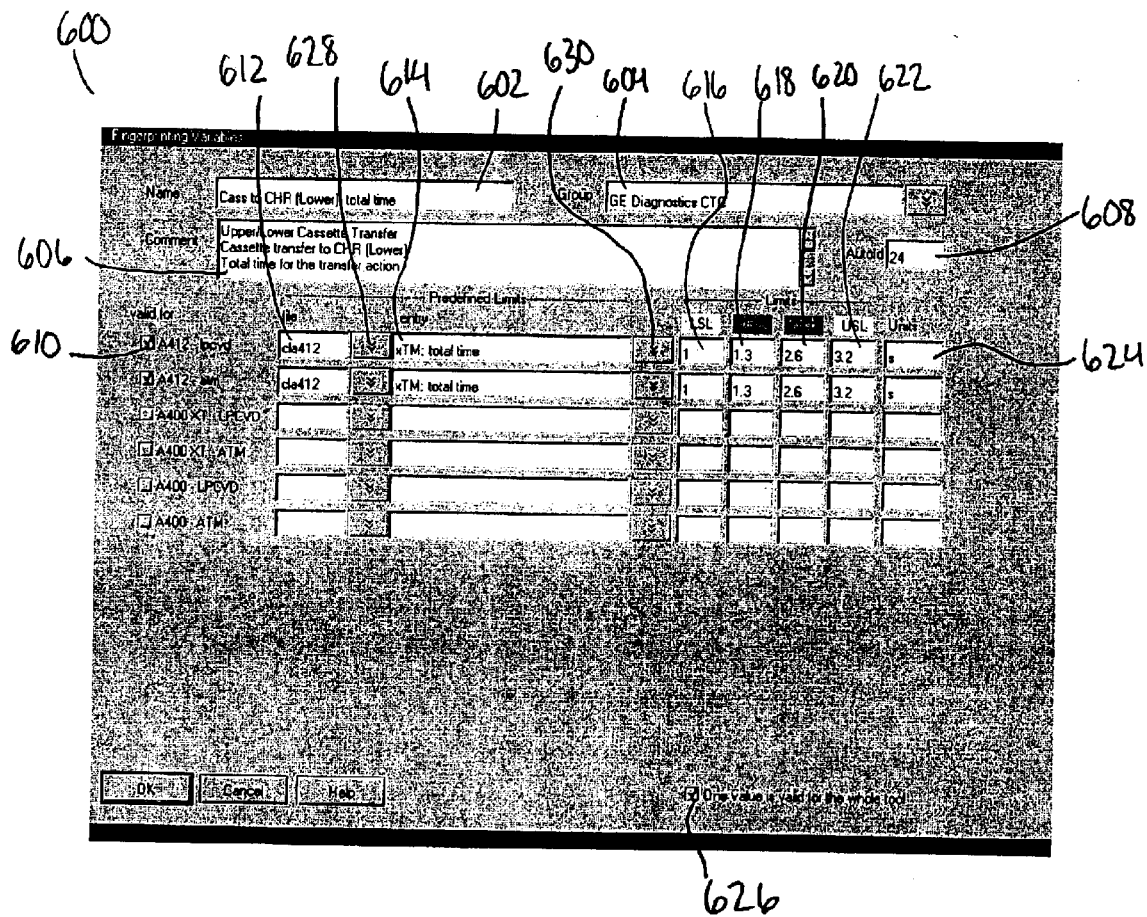
FIG. 6 shows a variable definition screen for defining performance variables used in measuring the performance of a semiconductor processing tool in accordance with a preferred embodiment of the present invention.

The variable definition screen 600 of the master file editor 130 illustrated in FIG. 6 presents several fields for editing or defining one or more desired target values and limits for a performance variable. Field 602, labeled "Name," allows a user to enter a name for the performance variable. The name preferably uniquely identifies the variable. Field 604, labeled "Group," allows a user to optionally assign the variable to a group of one or more variables. The user may select an existing group displayed in a drop down list box or may enter a new group name. Field 606, labeled "Comment," may advantageously be used to provide instructions to a tester (e.g., inform him how to physically inspect a device or physically collect a measurement). Field 608, labeled "Autold," is an identifier for measurements that the fingerprinting test application 150 automatically collects; as described below, certain measurements can be measured automatically by the fingerprinting test application 150. Check boxes that are labeled "valid for" (e.g., check box 610) allow a user to indicate the tool types for which the variable should be measured, which helps automate later test file generation. The fields that are labeled "file" (e.g., field 612) and the corresponding fields that are labeled "entry" (e.g., field 614) are for associating a performance variable with a set of predefined limits, which is discussed in detail below. Fields that are labeled "LSL" (e.g., field 616) allow a user to enter a lower specification limit. Fields that are labeled "LCL" (e.g., field 618) allow a user to enter a lower control limit. Fields that are labeled "UCL" (e.g., field 620) allow a user to enter an upper control limit. Fields that are labeled "USL" (e.g., field 622) allow a user to enter an upper specification limit. Fields that are labeled "Units" (e.g., field 624) allow a user to enter the units for the limits. The checkbox 626, labeled "One value is valid for the whole tool," allows the user to indicate if the variable should be measured per tool or, when a tool comprises more than one reactor (e.g., process tube), for each reactor in a tool. FIG. 6 illustrates an example wherein an existing, defined variable is edited; however, in FIG. 5, if the user had pressed the new button 514, the fields in FIG. 6 advantageously would have been empty for definition by the authorized user.

The tool type names illustrated in FIG. 6 are associated with the check boxes that are labeled "valid for." These tool type names may advantageously represent a primary tool type (e.g., a series or "family" of tools) and may advantageously represent a secondary tool type (e.g., a genus of tools). For example, FIG. 6 illustrates primary tool types (e.g., A412™, A400XT™, and A400™, which are model names of vertical furnaces commonly available from ASM International, N.V. of Bilthoven, The Netherlands, or its subsidiaries). In this example, A412, which is a furnace for 300 mm wafer processing, has two secondary tool types: an LPCVD reactor and an atmospheric (ATM) reactor. As discussed herein, the fingerprinting software 110 generates the test file 170, which is advantageously adapted for a tool. The "valid for" check boxes (e.g., check box 610) are advantageously associated with a tool type, a tool species, or both. Accordingly, when a selected checkbox matches a specific tool for which a test file is being generated, the fingerprinting software 110 advantageously causes the automatically generated, tool-customized test to include the performance variable being defined in variable definition screen 600. The data associating performance variables with a tool type, a tool species, or both is stored in any suitable location using any suitable means, preferably in the master file 160. In another embodiment, the master file comprises one or more type definition files (not shown) stored on a computer-readable medium in one or more of the controller, a computer coupled to the controller, and a computer not coupled to the controller.

The tools of the preferred embodiments generally comprise two reactors, which can be different or identical reactors. Preferably, the number of tool types should be kept limited. In one embodiment, the number of types is twelve or fewer. However, any suitable number of types may be used. If a certain variable should be tested for a certain tool type, the corresponding check box should be checked.

The variable definition screen 600 allows a user to define control limits and specification limits. The specification limits define the acceptable range for an actual value of a variable. When an actual value is "outside specification," the value is unacceptable. For example, the specification limits may advantageously indicate an unacceptably high risk of tool damage or wafer damage. The control limits define the narrower, preferred range for an actual value of a variable. For example, the control limits may advantageously indicate optimum performance. Preferably, the actual value is not only within the specification limits but also within the control limits.

In one embodiment, the values of the variable's limits (e.g., "LSL," "LCL," "UCL," "USL") may be edited manually using a keyboard, touch screen, a mouse or the like. In a preferred embodiment, these are edited by authorized personnel (e.g., at a remote computer, with a password, or the like).

In another embodiment, a variable's limits may advantageously be selected from a set of predefined limits. Thus, when limits are common among multiple variables and multiple tools, accessing a set of predefined limits avoids manual entry of the limits and ensures consistency of the limits. For example, in one embodiment, selecting the button 628 allows the user to choose a limits file (see FIG. 7 and related text), comprising one or more entries. An entry preferably comprises a set of one or more limit values and an associated unit of measurement. After selection of the limits file, the user may press button 630 to select an entry. Upon selection of an entry, the one or more limits of the selected entry advantageously appear in the associated fields in the variable definition screen 600. In a further embodiment, after selection of a limits file and selection of an entry, any manual editing of the variable's limits values will clear the file and entry fields. The limits file may comprise any suitable structure that is accessible by the master file editor 130.

In one embodiment, the limits file is a comma-delimited file (e.g., a *.CSV file). For example, in a further embodiment, the comma-delimited file is generated using a commercially available spreadsheet software program, such as Microsoft Excel. FIG. 7 illustrates an example spreadsheet 700 of one embodiment. The first row 710 in the spreadsheet 700 has a hash symbol (#), followed by a short description. The second row 720 has a hash symbol (#), followed by column titles. The following rows (e.g., row 730) advantageously include an entry name (e.g., "Spike 300~C"), one or more associated predefined limits (e.g., "260," "260," "320," "320"), and an associated unit of measurement (e.g., degrees centigrade). These entry names, limits, and units are preferably automatically entered into the associated fields in the variable definition screen 600 upon selection of an entry, as described above with respect to button 628 of FIG. 6. In one embodiment, the file name's length should be appropriate for the system upon which it resides.

As described above, certain values for limits, units of measurements, or both are preferably defined within the master file 160 (e.g., using user entry, a limits file, or the like) before a particular test file is generated. However, in some situations, the fingerprinting software 110 advantageously does not define a performance variable until the actual test file is generated. Accordingly, the performance variable acts as a placeholder for customized limits, units of measurements, or both, to be added later. For example, a wafer boat typically has a set of performance variables that may vary with a particular boat's design (e.g., size, number of slots, pitch, delta pitch, offset or the like). Because a tool may use one or more different boat designs, switching boat designs requires switching the set of performance variables for the test, which can take time (e.g., switching each of the variables) and induce errors (e.g., switching less than all of the variables). Accordingly, the fingerprinting software 110 is preferably configured to allow "late binding," such that one may select a variable such as a boat design (e.g., via selection of a part number) to associate the proper set of performance variables with the proper limits, units of measurements, or both, later than or outside of the master file definition process.

Figure 8:
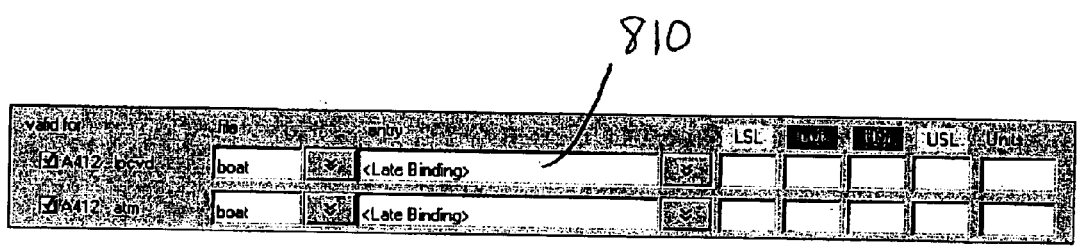
FIG. 8 shows a portion of the variable definition screen where limits are advantageously bound to a performance variable using "late binding" in accordance with a preferred embodiment of the present invention.

In one embodiment, one or more sets of pre-defined limits, units of measurements, or both are stored in a "late binding" file on a computer-readable medium, which is accessible by fingerprinting software 110. Referring to FIGS. 6 and 8, when using late binding, the variable definition screen 600 presents an entry field 810 that indicates late binding is used. For example, in one embodiment, field 810 displays "<Late Binding>" to indicate that late binding is used; however any suitable method of indication may be used. In one embodiment, the late binding file is a comma-delimited file (e.g., a *.CSV file). For example, in a further embodiment, the comma-delimited file is generated using a commercially available spreadsheet software program, such as Microsoft Excel. FIG. 9 illustrates an example spreadsheet 900 of one embodiment. As illustrated, the first row 910 of the spreadsheet 900 contains the text "!Late Bind." The second row 920 has a hash symbol (#), followed by column titles. The following rows (e.g., row 930) advantageously include a part number (e.g., part number "2504723-0" for a particular model of boat), a line value (e.g., "Boat ? Size") that preferably indicates a performance variable, one or more associated predefined limits (e.g., "200," "200," "200," "200"), and an associated unit of measurement (not shown). Thus, the spreadsheet 900 includes the limits for one or more variables (e.g., size, slots, pitch, delta pitch, offset) for a particular part number (e.g., "2504723-0"). When a part number is selected during testing, as discussed below, via late binding, the limits for the one or more variables are defined using the values in the spreadsheet 900. The spreadsheet 900 may advantageously include two or more sets of one or more groups of performance variables. For example, where 2 part numbers are available and there are 5 associated performance variables, the spreadsheet 900 would advantageously include 10 rows of data for those variables. Accordingly, each part number would be advantageously associated with a set of rows. In another embodiment, the late binding file is stored in any suitable format, including but not limited to a file other than a comma-delimited file.

The fingerprinting software 110 can advantageously record values that are entered as text (e.g., a comments field) or entered as an on-off value (e.g., a check box). For example, with respect to the limits files and the late binding files, when all the limits values are set to "0" and the units field is blank, the value entered in testing is accepted as text. Similarly, with respect to the limits files and the late binding files, when all the limits values are set to "1" and the units field reads "Check," the performance variable will be a check box. Any other suitable method of indicating that a variable is a check box or a text field may be used.

Test File Editor

As discussed above, the master file 160 comprises the performance variables that are used to measure the performance of one or more semiconductor processing tools. In a preferred embodiment, the test file editor 140 is used to create a test file 170. To create a test file 170, performance variables are advantageously selected from the master file 160 and any "late binding" variables are advantageously filled in. Additionally, other suitable information fields (e.g., test date, tester name) for later entry are preferably added.

Figure 10:
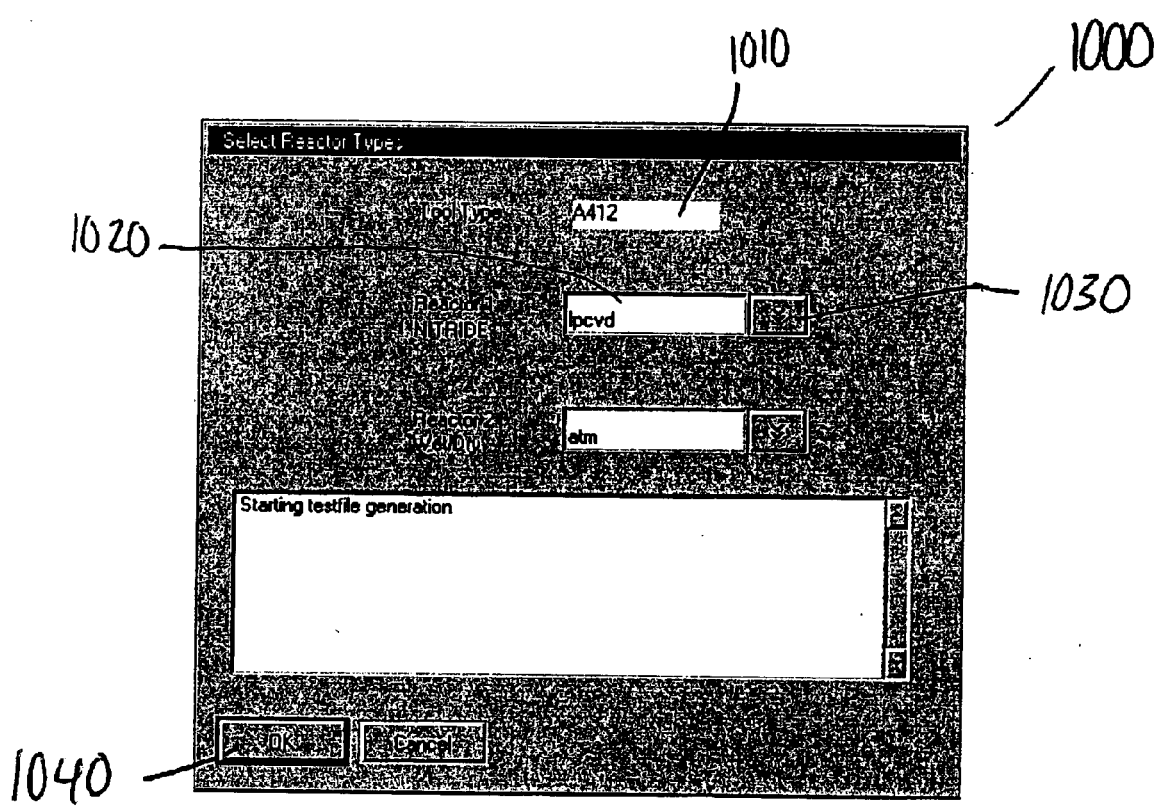
FIG. 10 shows a screen used to generate a test file customized according to the selected reactor type(s) in accordance with a preferred embodiment of the present invention.

In one embodiment, pressing a button 516 illustrated in FIG. 5 opens a select reactor types screen 1000 illustrated in FIG. 10. The tool type is selected with a field 1010 and the applicable reactors are selected with a pull down menu (e.g., menu 1020) by pressing a button (e.g., button 1030). In another embodiment, other selection options are used for other tool configurations. For example, if tools comprise three or more selectable reactors or sub-modules (e.g., process tubes), wherein the sub-modules can be of different design, a selection option for each of these sub-modules is provided. Further, if a tool does not comprise selectable sub-modules, a selection option is not provided. Pressing button 1040 starts the test file generation.

Figure 11:
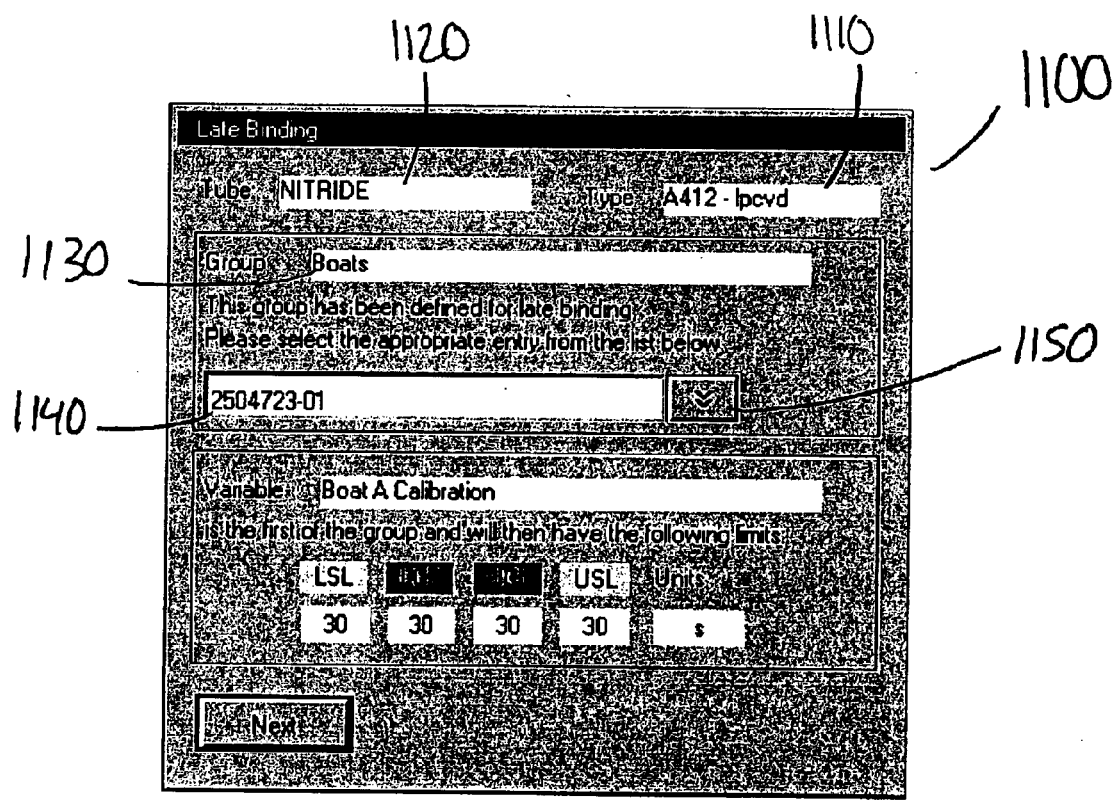
FIG. 11 shows a screen used to "late bind" limits to a performance variable in a test file of the preferred embodiment in accordance with a preferred embodiment of the present invention.

If there are any late binding variable groups associated with the chosen tool types and configuration, the late binding screen 1100 will appear as illustrated in FIG. 11. The late binding screen 1100 shows the tool type 1110, a reactor or tube name or label 1120, and the late binding variable group 1130. The user is prompted to select an entry 1140 from the late binding list, using the button 1150. The late binding list comprises selectable boat part numbers. Where more than one late binding group is associated with the chosen tool types and configuration, the late binding screen 1100 preferably appears for each late binding variable group.

In the illustrated embodiment, the test file editor 140 is integrated with the master file editor 130. In a preferred embodiment, the test file editor 140 and the master file editor 130 are not integrated, which advantageously prevents a user of the test file editor 140 from using the master file editor 130 to edit variables and change their associated limits. Thus, uncontrolled altering of test criteria or bypassing tests is advantageously avoided when acquiring, storing, and reporting quality assurance data. For example, as illustrated in FIG. 3, persons on a master file definition board (e.g., a group of authorized users) may use the master file editor 130 to determine the variables in the master file 160, whereas a test file generation group (e.g., a different group of authorized users) may prepare a specific test file 170 for a specific tool without influencing or changing the contents of the master file 160.

Fingerprinting Test Application.

Figure 12:
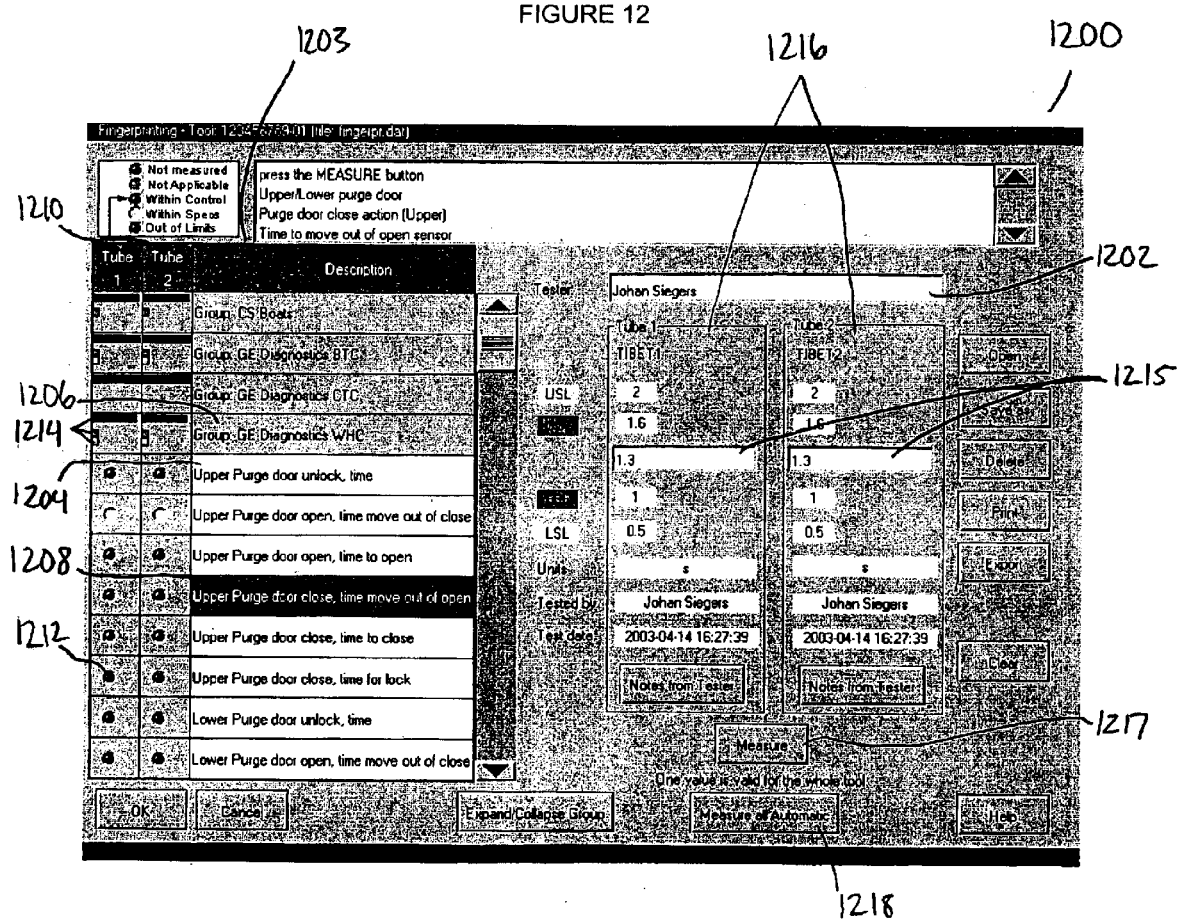
FIG. 12 shows a fingerprinting test application screen where the status of one or more performance variables is collected, displayed, and analyzed in accordance with a preferred embodiment of the present invention.

The fingerprinting test application 150 includes a screen 1200 illustrated in FIG. 12. The screen 1200 displays the status for the available variables. In one embodiment, a tester may not perform measurements, unless the tester's name is entered into field 1202. Accordingly, in that embodiment, the measurement portion of the fingerprinting test application will be enabled after entering the tester's name. The tester name is then advantageously used to indicate the measurements that the tester has made. In a further embodiment, the input to the field 1202 is protected in by any suitable method, including but not limited to using a password.

As illustrated in FIG. 12, a menu 1203 displays the available performance variables. The menu advantageously displays one or more single variables, for example, variable 1204. A single variable may advantageously be given a color to represent that it is a single variable, such as, for example, white. The menu 1203 advantageously displays one or more groups of variables, for example, variable group 1206, entitled "GE Diagnostics WHC" [general diagostics wafer handling controller]. A group of variables may advantageously be given a color to represent that it is group of variables, such as, for example, light gray. When a variable or a group of variables is selected, the variable or group may advantageously be given a color to represent that it is currently selected, such as dark gray. For example, variable 1208, entitled "Upper purge door close, time move out of open sensor," is currently selected. The variable group 1206 illustrated as being expanded. A group may be expanded and collapsed in the manner described above with respect to the master file editor 130 and FIG. 5.

As illustrated in FIG. 12, one or more columns 1210 are provided for each tube or reactor that is present in the semiconductor processing tool. In the illustrated embodiment, two tubes are represented; however, any suitable number of tubes may be represented by a corresponding number of columns. The columns 1210 advantageously include indicators that indicate a measurement status, a measured value, or both. When a variable was selected as "One value is valid for the whole tool" as described above with respect to checkbox 626 and FIG. 6, the limit field and result field for tubes 1 and 2 advantageously display identical values. The indicators may advantageously have associated colors to represent a measurement status, a measured value, or both. For example in one embodiment, black indicates the variable is not measured; blue indicates that the variable is not applicable; green indicates the value of the variable is within control limits; yellow indicates the value of the variable is outside control limits, but within specification limits; and red indicates the value of the variable is outside specification limits. An indicator can advantageously be associated with a single variable, such as, for example, indicator 1212. An indicator can advantageously be associated with a group, such as, for example, bar charts 1214. As illustrated, the bar charts preferably show the accumulated status of the variables within the group.

As illustrated in FIG. 12, one or more sections 1216 display the limits and the measured value for the selected variable for each tube or reactor. In the illustrated embodiment, two tubes are represented; however, any suitable number of tubes and reactors may be represented by a corresponding number of sections.

Some performance variables are inapplicable during testing under certain circumstances (e.g., a certain module of the tool is not installed because its shipping was delayed or another suitable reason). It follows that, where a module is not installed, the associated performance variables should be ignored. In one embodiment, a variable may be ignored by the system by entering a designated "ignore" character (e.g., a dash "-") or the like into the entry fields 1215. The ignore character is a special, predefined sign that will be interpreted by the system to mean that it should ignore this variable. Any suitable graphical user interface element or other entry element may be used to ignore variables.

As described above, fingerprinting test application 150 preferably automatically collects performance data for certain performance variables without manual entry. In one embodiment, when an automatic variable is selected in the menu 1203, a measure button 1217 appears. When the measure button 1217 is pressed, the selected variable and any related variables are advantageously measured. In a further embodiment, the selected variable and the variables in its group are measured. For example, "GE Diagnostics WHC" is a group that relates to robotic movement of the wafer handler robot, which is controlled by a wafer handler controller (not shown). Thus, when the measure button 1217 is pressed for an automatic variable in GE Diagnostics WHC, the values of the GE Diagnostics WHC variables are then communicated from the wafer handler controller to the fingerprinting test application 150. Also shown at the bottom of the screen is a button 1218, labeled "Measure all Automatic." When the button 1218 is pressed, the variables that can be measured automatically are measured In one embodiment, certain automatic variables are measured after a tester manually initiates a specific test action, such as a robotic movement or the like. Where a robotic movement would pose a safety risk, this embodiment advantageously requires the tester to purposefully initiate a specific test action. In a further embodiment, if the fingerprinting test application 150 tries to measure an automatic variable that requires a prior test action and the test action has not been performed, the fingerprinting test application 150 will collect a default value for the variable that is outside of the specification limits (e.g., zero or the like). Not all automatically measured variables have associated test actions (e.g., verifying software release numbers of the control software installed on the tool).

In another embodiment, when the measure button is pressed, related test actions, if any, are automatically caused, and the selected variable and any related variables are advantageously measured. Thus, when the measure button is pressed for an automatic variable, the controller 120 causes the sub-controller to perform certain robotic movements. The values of the associated performance variables are then communicated from the sub-controller to the fingerprinting test application 150. Thus, where a robotic movement would be safe or otherwise desirable, this embodiment advantageously automatically initiates a specific test action and measures the associated variables. Similarly, in this embodiment, when the button 1218 is pressed, related test actions, if any, are caused, and the variables that can be measured automatically are then measured.

Figure 13:
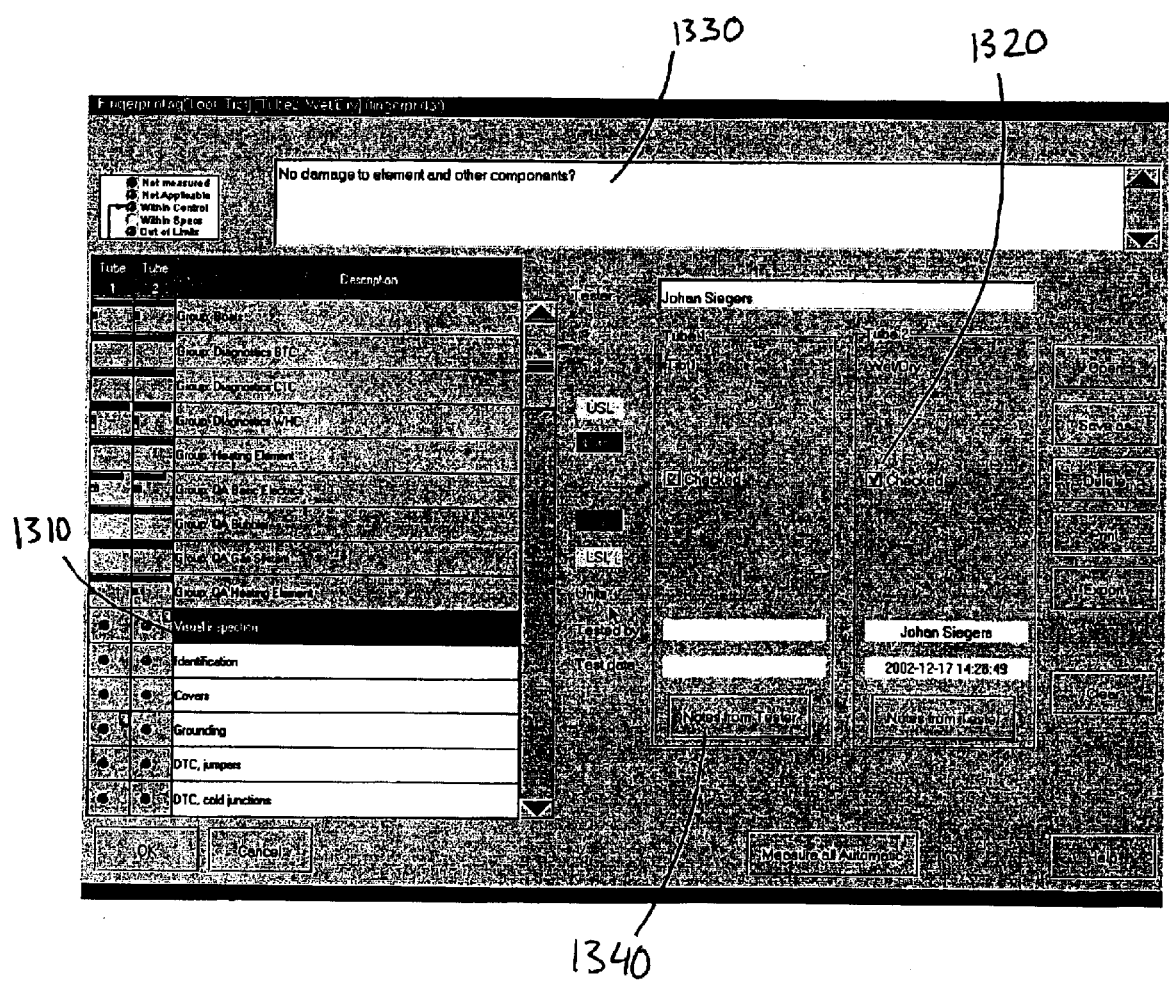
FIG. 13 shows an embodiment of a fingerprinting test application screen where a status of a performance variable is checked during testing by user interaction.
Figure 14:
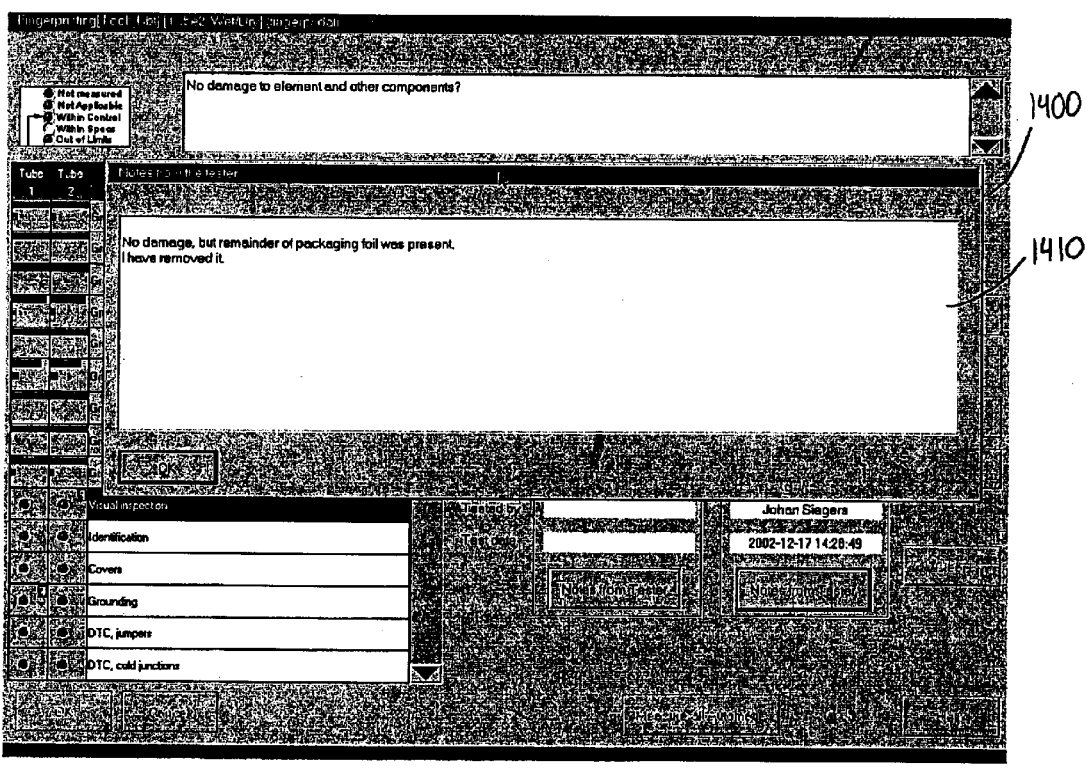
FIG. 14 shows a screen in which a tester may record notes in accordance with a preferred embodiment of the present invention.

FIG. 13 illustrates an embodiment of the screen illustrated in FIG. 12, wherein a selected variable 1310, labeled "Visual Inspection," calls for user action (e.g., "manual measurement") rather than automated measure of a value. In this embodiment, if a variable requires inspection (as opposed to measurement), a check box, such as check box 1320, appears. After the check is performed, the check box can be selected. As further illustrated in FIG. 13, detailed instructions for the tester may be displayed in field 1330. In another embodiment, the tester can advantageously add notes by pressing a button labeled "Notes from Tester," (e.g., button 1340). When that button is pressed, a notes input screen 1400 appears as shown in FIG. 14. The tester may then enter notes into the field 1410.

As described above, variables may be measured automatically or may be manual (e.g., visual inspection or measurement by a user). In latter cases the value of the variable can be filled into fingerprinting test application 150 using any suitable input device, such as a keyboard, touch screen, mouse, or the like.

Figure 15:
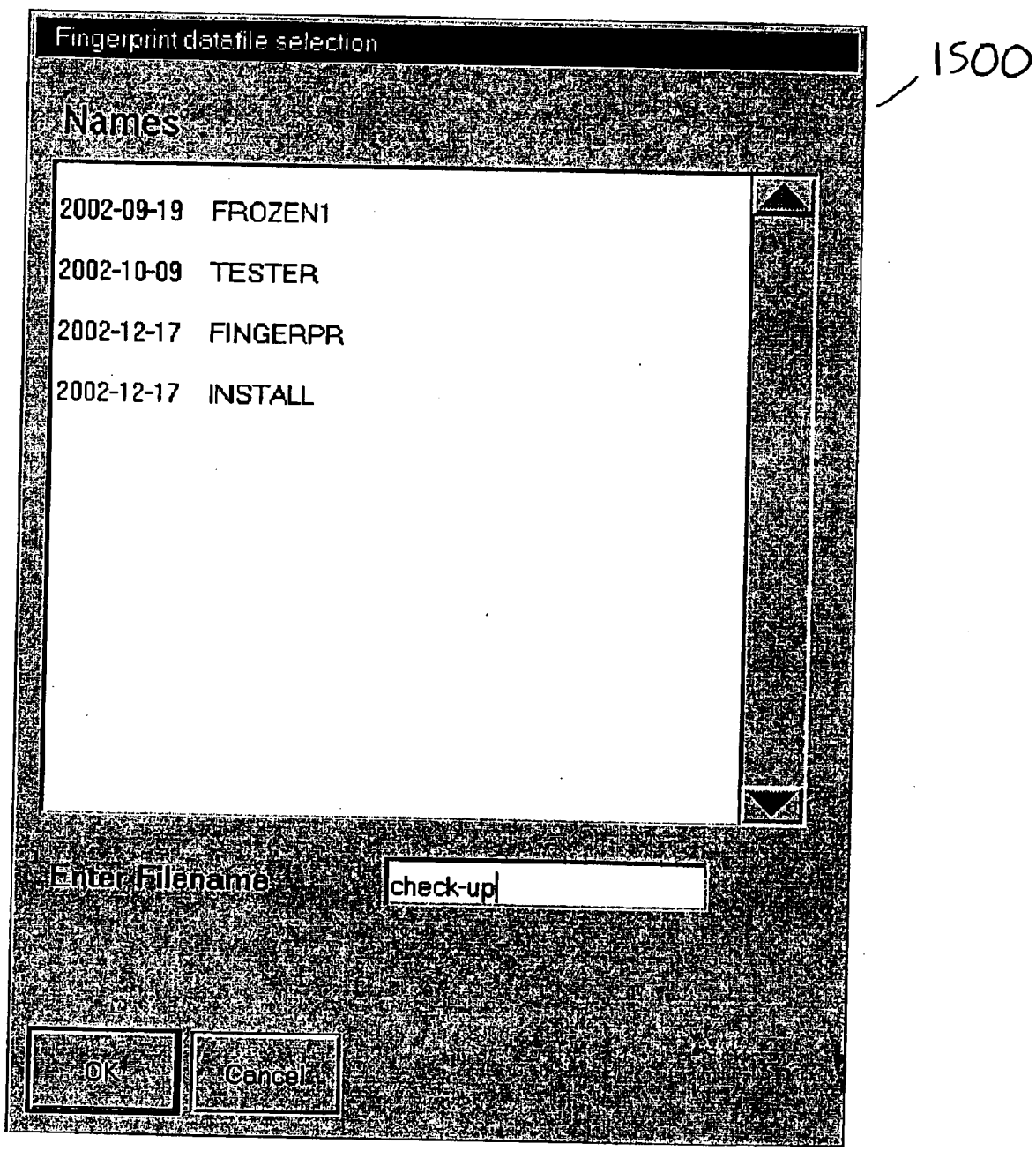
FIG. 15 shows a fingerprint data file selection screen that stores the measurements in one or more output files in accordance with a preferred embodiment of the present invention.

FIG. 15 illustrates an embodiment wherein a fingerprint data file selection screen 1500 is provided and the performance history data 180 is stored in at least one output file. As illustrated, the fingerprinting software 110 generates a current test file designated "FINGERPR," which is advantageously filled with data during testing. In one embodiment, after appropriate testing, the current test file may be saved as an unrestricted test file (e.g., any further testing may be performed) or as a restricted test file (e.g., some or all of the tests cannot be performed). In a further embodiment, the restricted test file's contents are "frozen" so that all of the tests cannot be performed. A restricted test file provides a "fingerprint" of the tool's status (e.g., the measured values of one or more performance variables at the time of testing). The fingerprinting software 110 may be advantageously used to compare the fingerprint to a current test file.

Although the foregoing invention has been described in terms of certain preferred embodiments, other embodiments will be apparent to those of ordinary skill in the art from the disclosure herein. For example, although some embodiments of the invention have been described with reference to performance variables used as fingerprinting variables, performance variables other than fingerprinting variables may be used. Additionally, other combinations, omissions, substitutions and modifications will be apparent to the skilled artisan in view of the disclosure herein. Accordingly, the present invention is not intended to be limited by the reaction of the preferred embodiments, but is to be defined by reference to the appended claims.

Further, some of the appended claims include elements having labels (e.g., "(a)" or "(b)"). These labels are for reference only and do not limit the order of the claimed processes.

Additionally, all publications, patents, and patent applications mentioned in this specification are herein incorporated by reference to the same extent as if each individual publication, patent, or patent application was specifically and individually indicated to be incorporated by reference.

We claim:

1. A computer-readable-medium containing computer-executable instructions for performing a method for assuring the quality of a semiconductor processing tool, the semiconductor processing tool coupled to a process tool controller, the method comprising:
   (a) measuring a first set of values for a test set of one or more performance variables, the one or more performance variables being adapted to measure the performance of the semiconductor processing tool;
   (b) storing the first set of values in a computer-readable medium coupled to the process tool controller;
   (c) subsequently measuring a second set of values for the test set of one or more performance variables;
   (d) storing the second set of values in a computer-readable medium coupled to the process tool controller;
   (e) retrieving the first set of values from the computer-readable medium storing the first set of values, after performing element (c); and
   (f) comparing the second set of values with the first set of values.

2. The computer-readable-medium of claim 1, wherein the method further comprises:
   (g) creating a master file, including a master set of one or more performance variables being adapted to measure the performance of the semiconductor processing tool;
   (h) creating a test file, including the test set of one or more performance variables, wherein the test set of one or more performance variables are selected from the master set of one or more performance variables.

3. The computer-readable medium of claim 2, wherein (h) creating the test file comprises selection of the test set of performance variables based upon a classification category of the processing tool.

4. The computer-readable-medium of claim 2, wherein elements (a), (b), (c), (d), and (e) are performed at least once after installing the semiconductor processing tool.

5. The computer-readable-medium of claim 1, wherein at least one of the test set of values is acquired using one or more sensors in response to a first user command, the sensors coupled to the process tool controller.

6. The computer-readable-medium of claim 5, wherein the method further comprises:
   (i) causing the semiconductor processing tool to perform an action prior to performing element (a), wherein at least one of the test set of one or more performance variables is adapted to automatically measure a performance value during the action; and
   (j) storing the performance value;
   wherein element (a) comprises retrieving the stored performance value.

7. The computer-readable-medium of claim 6, wherein element (i) is initiated in response to a second user command, the second user command being prior to the first user command.

8. The computer-readable-medium of claim 1, wherein at least one of the test set of values is acquired by manual input into a software module installed on the process tool controller.

9. The computer-readable-medium of claim 1, wherein elements (a), (b), (c), and (d) are performed prior to installing the semiconductor processing tool.

10. The computer-readable-medium of claim 1, wherein elements (a) and (b) are performed prior to installing the semiconductor processing tool and elements (c) and (d) are performed at least once after installing the semiconductor processing tool.

11. The computer-readable-medium of claim 1, wherein elements (a), (b), (c), and (d) are performed at least once after installing the semiconductor processing tool.

12. The computer-readable-medium of claim 1, wherein storing the first set of values and storing the second set of values comprises storing each set of values in the same computer-readable medium.

13. The computer-readable-medium of claim 1, wherein the process tool controller comprises an other computer-readable medium, containing second computer-executable instructions defining a sequence of processing steps in a processing recipe wherein elements (a), (b), (c) and (d) are performed at a time when no processing recipe is executed.

14. The computer-readable medium of claim 1, wherein comparing comprises displaying a comparison of the first and second set of values.

15. A computer-readable-medium containing computer-executable instructions for performing a method for assuring the quality of a semiconductor processing tool, the semiconductor processing tool coupled to a process tool controller, the method comprising:
   (a) storing a first set of performance variables as a master file in a first computer-readable medium, at least one of the first set of performance variables being associated with at least one semiconductor processing tool type and being associated with one or more limit values;
   (b) selecting a semiconductor processing tool type;
   (c) in response to element (b), selecting a second set of performance variables from among the performance variables in the first set of one or more performance variables, said second set of one or more performance variables being associated with the semiconductor processing tool type selected in element (b); and
   (d) storing the second set of one or more performance variables with associated limit values in a second computer-readable medium.

16. The computer-readable-medium of claim 15, wherein the method further comprises:
   (e) for at least one of the second set of one or more performance variables, acquiring a test value and displaying a comparison of the acquired test value to at least one associated limit value.

17. The computer-readable-medium of claim 16, wherein the second set of one or more performance variables comprises one or more groups of variables and further comprising displaying an aggregate display of the comparison status of the individual performance variables within at least one of the groups of variables.

18. The computer-readable-medium of claim 15, further comprising at least one software module installed on the process tool controller.

19. The computer-readable-medium of claim 18, wherein the second set of one or more performance variables comprises one or more groups of variables and further comprising displaying an aggregate display of the acquisition status of the individual performance variables within at least one of the groups of variables.

20. The computer-readable-medium of claim 15, wherein the method further comprises:
   (f) for at least one of the second set of one or more performance variables, displaying whether a value has been acquired for the variable.

21. A process tool controller configured to perform a method for assuring the quality of a semiconductor processing tool coupled to the process tool controller, the method comprising:

(a) acquiring a set of processing tool values for a test file, the test file comprising a subset of semiconductor processing tool performance variables automatically generated from a master file;

(b) storing the set of values in a first computer-readable medium.

22. The process tool controller of claim 21 wherein the first computer-readable medium is in the controller.

23. The process tool controller of claim 21, wherein the first computer-readable medium is coupled to the controller.

24. The process tool controller of claim 21, wherein the method is not perform during wafer processing.

* * * * *